US012185530B2

(12) United States Patent
Chang

(10) Patent No.: US 12,185,530 B2
(45) Date of Patent: Dec. 31, 2024

(54) ANTI-FUSE SENSING DEVICE AND OPERATION METHOD THEREOF

(71) Applicant: NANYA TECHNOLOGY CORPORATION, New Taipei (TW)

(72) Inventor: Chih-Hang Chang, Hsinchu (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 433 days.

(21) Appl. No.: 17/710,971

(22) Filed: Mar. 31, 2022

(65) Prior Publication Data

US 2023/0317600 A1    Oct. 5, 2023

(51) Int. Cl.
*G11C 17/00* (2006.01)
*G11C 17/16* (2006.01)
*H10B 20/20* (2023.01)

(52) U.S. Cl.
CPC .......... *H10B 20/20* (2023.02); *G11C 17/165* (2013.01)

(58) Field of Classification Search
CPC ....... G11C 17/18; G11C 17/16; G11C 17/165; G11C 29/027; G11C 29/50; G11C 2029/5004; G11C 5/143; G11C 5/148; G11C 11/4074; G11C 11/4078; G11C 11/4087; G11C 11/4091; G11C 11/4094; G11C 11/4099; G11C 17/143; G11C 29/50008; G11C 2029/0403; G11C 2029/0411; G11C 29/04; G11C 29/20; G11C 29/24; G11C 29/38; G11C 29/54; G11C 29/56004; H10B 20/20; H10B 20/00; H10B 20/25
See application file for complete search history.

(56) References Cited

U.S. PATENT DOCUMENTS

| 8,686,786 | B2 | 4/2014 | Park et al. |
| 9,330,794 | B1 | 5/2016 | Miyatake |
| 2003/0234665 | A1 | 12/2003 | Smith et al. |
| 2010/0164604 | A1 | 7/2010 | Park |
| 2023/0215505 | A1* | 7/2023 | Yang ..................... G11C 17/16 365/96 |

OTHER PUBLICATIONS

"Notice of allowance of Taiwan Counterpart Application", issued on Oct. 27, 2023, p. 1-p. 3.

* cited by examiner

*Primary Examiner* — Thong Q Le
(74) *Attorney, Agent, or Firm* — JCIPRNET

(57) ABSTRACT

An anti-fuse sensing device and an operation method thereof are provided. The anti-fuse sensing device includes an anti-fuse sensing circuit, a voltage generating circuit, and a power-on detection circuit. During a power-on transient period of the voltage generating circuit, the power-on detection circuit provides an initialization voltage to a control terminal of the anti-fuse sensing circuit to prevent a voltage level of the control terminal of the anti-fuse sensing circuit from being in an unknown state. After the power-on transient period ends, the voltage generating circuit provides a control voltage to the control terminal of the anti-fuse sensing circuit. The anti-fuse sensing circuit senses a resistance state of an anti-fuse based on the control voltage. During the period when the voltage generating circuit provides the control voltage, the power-on detection circuit stops providing the initialization voltage to the control terminal of the anti-fuse sensing circuit.

11 Claims, 11 Drawing Sheets

ANTI-FUSE SENSING DEVICE AND OPERATION METHOD THEREOF

BACKGROUND

Technical Field

The disclosure relates to an electronic circuit. In particular, the disclosure relates to an anti-fuse sensing device and an operation method thereof.

Description of Related Art

An anti-fuse may be applied in various electronic circuits to latch different information. For example, a dynamic random-access memory (DRAM) chip determines which redundant row and/or redundant column to be turned on using the anti-fuse. In terms of the anti-fuse, a blown anti-fuse has a low resistance value, and an unblown anti-fuse has a high resistance value. Based on the material of the anti-fuse, in some embodiments, the resistance value of the blown anti-fuse may fall within a range of 2 kiloohms (KΩ) to 100 KΩ, and the resistance value of the unblown anti-fuse may fall within a range of 5,000 KΩ to 20,000 KΩ.

FIG. 1 is a schematic circuit block diagram of a conventional integrated circuit 100. The integrated circuit 100 shown in FIG. 1 includes a voltage generating circuit 110, a plurality of anti-fuse sensing circuits (e.g., anti-fuse sensing circuits 120_1, 120_2, and 120_n), and a plurality of anti-fuses (e.g., anti-fuses 130_1, 130_2, and 130_n). The voltage generating circuit 110 is coupled to control terminals of the anti-fuse sensing circuits 120_1 to 120_n to provide a control voltage V11. The anti-fuse sensing circuit 120_1 may sense a resistance state of the anti-fuse 130_1 based on the control voltage V11, so as to know a blowing state (blown or unblown) of the anti-fuse 130_1. For the other anti-fuse sensing circuits 120_2 to 120_n and the other anti-fuses 130_2 to 130_n, reference may be made to the relevant description of the anti-fuse sensing circuit 120_1 and the anti-fuse 130_1.

Generally speaking, a great number of anti-fuses are included in an integrated circuit (e.g., a DRAM chip). As the number of anti-fuses increases, the parasitic capacitance of the transmission path of the control voltage V11 increases. When the power is turned on, that is, during a power-on transient period, the output of the voltage generating circuit 110 is not ready, so that the control voltage V11 is coupled by the parasitic capacitance to an unexpected level (coupling noise). The control voltage V11 in an unknown state may cause an unexpected change in the resistance state of one or more of the anti-fuses 130_1 to 130_n.

It should be noted that the contents of the section of "Description of Related Art" is used for facilitating the understanding of the disclosure. Part of the contents (or all of the contents) disclosed in the section of "Description of Related Art" may not pertain to the conventional technology known to persons with ordinary skilled in the art. The contents disclosed in the section of "Description of Related Art" do not mean to have been known to persons with ordinary skilled in the art prior to the time of filing this application.

SUMMARY

The disclosure provides an anti-fuse sensing device and an operation method thereof, to prevent a voltage level of a control terminal of an anti-fuse sensing circuit from being in an unknown state during a power-on transient period (i.e., during a period when the output of a voltage generating circuit is not ready).

In an embodiment of the disclosure, the anti-fuse sensing device includes an anti-fuse sensing circuit, a voltage generating circuit, and a power-on detection circuit. The anti-fuse sensing circuit is adapted to sense a resistance state of an anti-fuse based on a control voltage. The voltage generating circuit has an output terminal coupled to a control terminal of the anti-fuse sensing circuit to provide the control voltage. The power-on detection circuit has an output terminal coupled to the control terminal of the anti-fuse sensing circuit. During a power-on transient period of the voltage generating circuit, the power-on detection circuit provides an initialization voltage to the control terminal of the anti-fuse sensing circuit to prevent a voltage level of the control terminal of the anti-fuse sensing circuit from being in an unknown state. During a period when the voltage generating circuit provides the control voltage after the power-on transient period ends, the power-on detection circuit stops providing the initialization voltage to the control terminal of the anti-fuse sensing circuit.

In an embodiment of the disclosure, the operation method includes the following. During a power-on transient period of a voltage generating circuit of an anti-fuse sensing device, an initialization voltage is provided by a power-on detection circuit of the anti-fuse sensing device to a control terminal of an anti-fuse sensing circuit of the anti-fuse sensing device to prevent a voltage level of the control terminal of the anti-fuse sensing circuit from being in an unknown state. After the power-on transient period ends, providing the initialization voltage to the control terminal of the anti-fuse sensing circuit is stopped by the power-on detection circuit, and a control voltage is provided to the control terminal of the anti-fuse sensing circuit by the voltage generating circuit. A resistance state of an anti-fuse is sensed by the anti-fuse sensing circuit based on the control voltage.

Based on the foregoing, the anti-fuse sensing device according to the embodiments of the disclosure provides the initialization voltage to the control terminal of the anti-fuse sensing circuit utilizing the power-on detection circuit during the power-on transient period. Therefore, during the period when the output of the voltage generating circuit is not ready, the power-on detection circuit may prevent the voltage level of the control terminal of the anti-fuse sensing circuit from being in an unknown state. After the power-on transient period ends, since the output of the voltage generating circuit is ready, the power-on detection circuit may stop providing the initialization voltage, and the voltage generating circuit may instead provide the normal control voltage to the control terminal of the anti-fuse sensing circuit.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
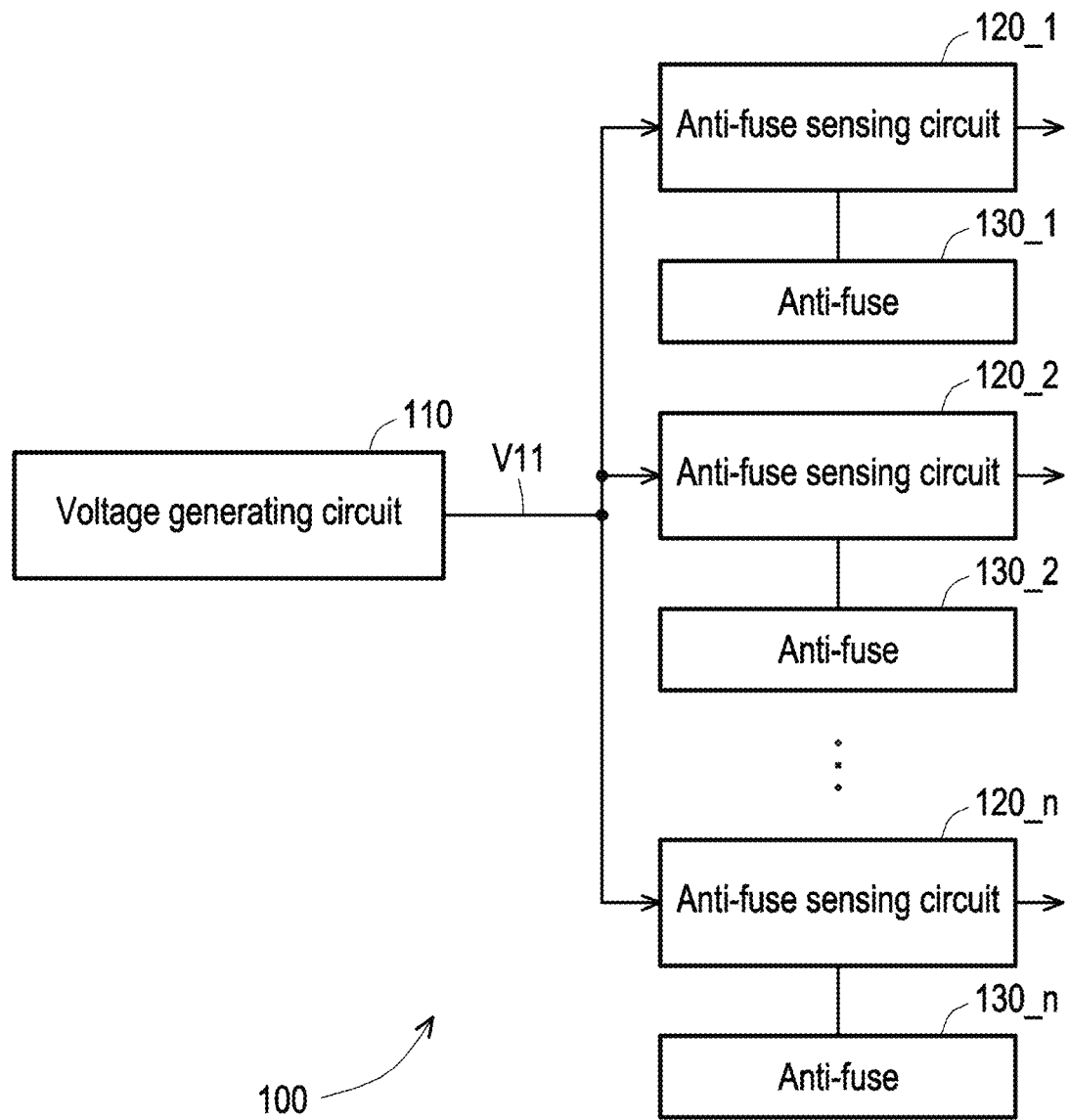
FIG. 1 is a schematic circuit block diagram of a conventional integrated circuit.

The term "coupling (or connection)" as used throughout this specification (including the claims) may refer to any direct or indirect means of connection. For example, if it is herein described that a first device is coupled (or connected) to a second device, it should be interpreted that the first device may be directly connected to the second device, or the first device may be indirectly connected to the second device through other devices or some connection means. Terms such as "first" and "second" mentioned through out the description (including the claims) are used to name elements, or to distinguish between different embodiments or scopes, and are not used to limit the upper or lower bound of the number of elements, nor used to limit the sequence of elements. In addition, wherever possible, elements/members/steps using the same reference numerals in the drawings and embodiments denote the same or similar parts. Cross-reference may be made to relevant descriptions of elements/members/steps using the same reference numerals or using the same terms in different embodiments.

Figure 2:
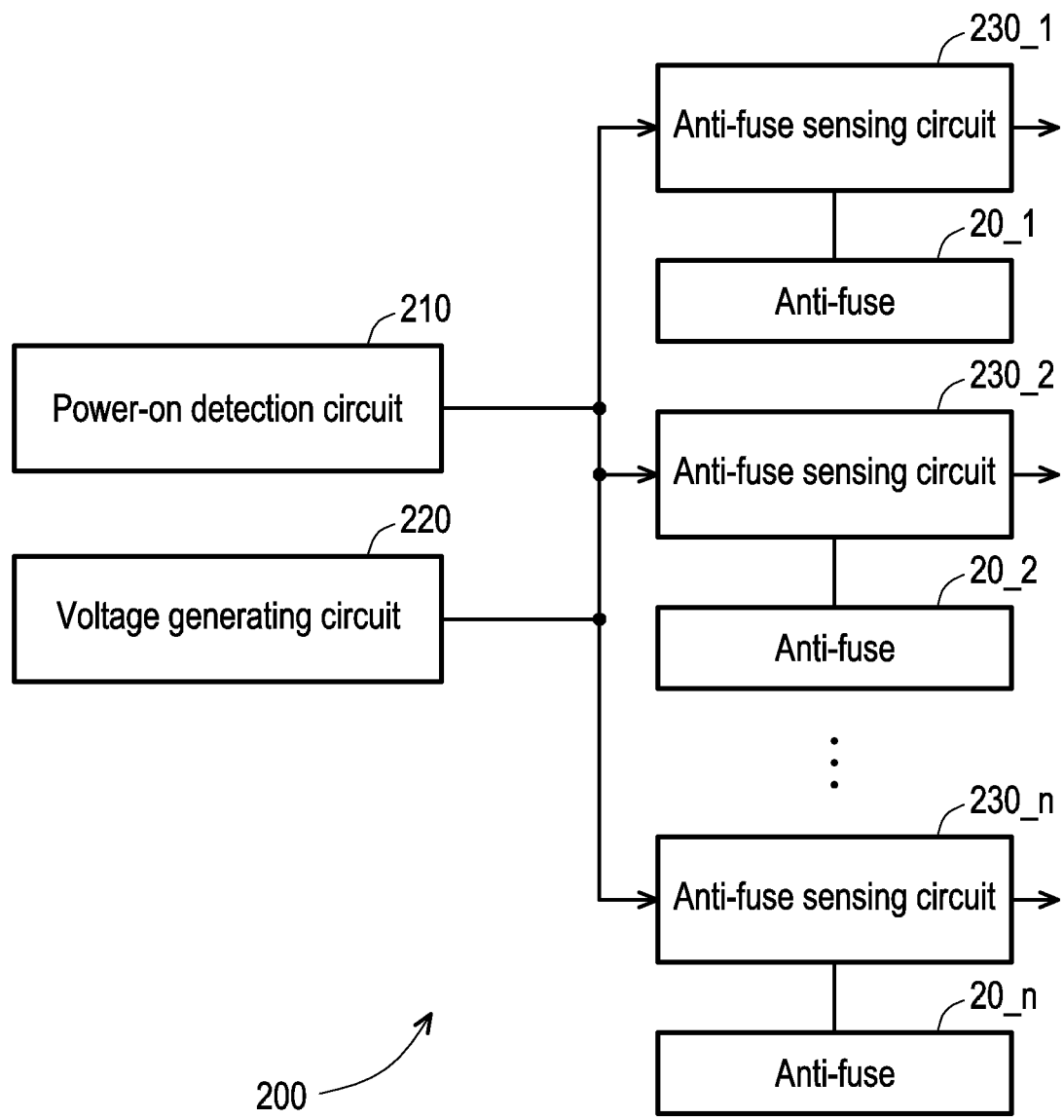
FIG. 2 is a schematic circuit block diagram of an anti-fuse sensing device according to an embodiment of the disclosure.

FIG. 2 is a schematic circuit block diagram of an anti-fuse sensing device 200 according to an embodiment of the disclosure. The anti-fuse sensing device 200 shown in FIG. 2 may sense resistance states of anti-fuses 20_1, 20_2, . . . , 20_n, to then obtain a blown/unblown state of the anti-fuses 20_1 to 20_n. In the embodiment shown in FIG. 2, the anti-fuse sensing device 200 includes a power-on detection circuit 210, a voltage generating circuit 220, and anti-fuse sensing circuits 230_1, 230_2, . . . , 230_n. An output terminal of the voltage generating circuit 220 is coupled to control terminals of the anti-fuse sensing circuits 230_1 to 230_n. When the output of the voltage generating circuit 220 is ready, the voltage generating circuit 220 may provide a control voltage to the control terminals of the anti-fuse sensing circuits 230_1 to 230_n. The anti-fuse sensing circuits 230_1 to 230_n may sense the resistance states of the anti-fuses 20_1 to 20_n based on the control voltage provided by the voltage generating circuit 220.

However, it is possible that the output of the voltage generating circuit 220 is not ready at the initial stage after being powered-on. The period when the output of the voltage generating circuit 220 is not ready after being powered-on may be referred to as "a power-on transient period of the voltage generating circuit 220". An output terminal of the power-on detection circuit 210 is coupled to the control terminals of the anti-fuse sensing circuits 230_1 to 230_n. During the power-on transient period of the voltage generating circuit 220, the power-on detection circuit 210 may provide an initialization voltage to the control terminals of the anti-fuse sensing circuits 230_1 to 230_n, to prevent voltage levels of the control terminals of the anti-fuse sensing circuits 230_1 to 230_n from being in an unknown state. The initialization voltage has a known level (an expected level) determined according to the actual design. The initialization voltage does not cause an unexpected change in the resistance state of any one of the anti-fuses 20_1 to 20_n. For example, in some embodiments, the initialization voltage may be a ground voltage or other fixed voltages.

Figure 3:
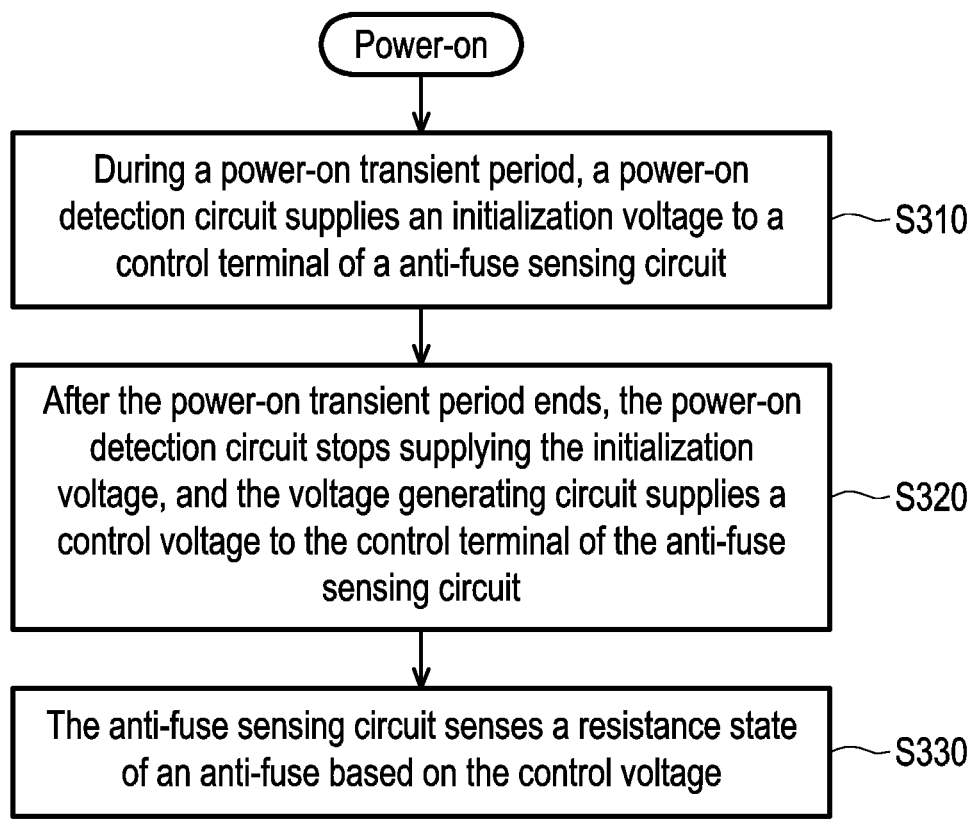
FIG. 3 is a schematic flowchart of an operation method of an anti-fuse sensing device according to an embodiment of the disclosure.

FIG. 3 is a schematic flowchart of an operation method of an anti-fuse sensing device according to an embodiment of the disclosure. With reference to FIG. 2 and FIG. 3, after being powered-on, the voltage generating circuit 220 enters the power-on transient period. During the power-on transient period, the output of the voltage generating circuit 220 is not ready. For example, the output terminal of the voltage generating circuit 220 is in a high-impedance (or referred to as Hi-Z) state during the power-on transient period. During the power-on transient period of the voltage generating circuit 220, the power-on detection circuit 210 may provide an initialization voltage (e.g., a ground voltage or other fixed voltages) to the control terminals of the anti-fuse sensing circuits 230_1 to 230_n (step S310), to prevent the voltage levels of the control terminals of the anti-fuse sensing circuits 230_1 to 230_n from being in an unknown state.

After the power-on transient period of the voltage generating circuit 220 ends, the voltage generating circuit 220 may provide a control voltage to the control terminals of the anti-fuse sensing circuits 230_1 to 230_n (step S320). The anti-fuse sensing circuits 230_1 to 230_n may sense the resistance states of the anti-fuses 20_1 to 20_n based on the control voltage provided by the voltage generating circuit 220 (step S330), to then obtain a blown/unblown state of the anti-fuses 20_1 to 20_n. During the period when the voltage generating circuit 220 provides the control voltage, the power-on detection circuit 210 stops providing the initialization voltage to the control terminals of the anti-fuse sensing circuits 230_1 to 230_n (step S320). For example, the output terminal of the power-on detection circuit 210 is in a high-impedance (Hi-Z) state after the power-on transient period of the voltage generating circuit 220 ends.

In summary of the above, the anti-fuse sensing device 200 may provide the initialization voltage to the control terminals of the anti-fuse sensing circuits 230_1 to 230_n utilizing the power-on detection circuit 210 during the power-on transient period. Therefore, during the period (the power-on transient period) when the output of the voltage generating circuit 220 is not ready, the power-on detection circuit 210 may prevent the voltage levels of the control terminals of the anti-fuse sensing circuits 230_1 to 230_n from being in an unknown state. After the power-on transient period ends, since the output of the voltage generating circuit 220 is ready, the power-on detection circuit 210 may stop providing the initialization voltage, and the voltage generating circuit 220 may instead provide the normal control voltage to the control terminals of the anti-fuse sensing circuits 230_1 to 230_n.

Figure 4:
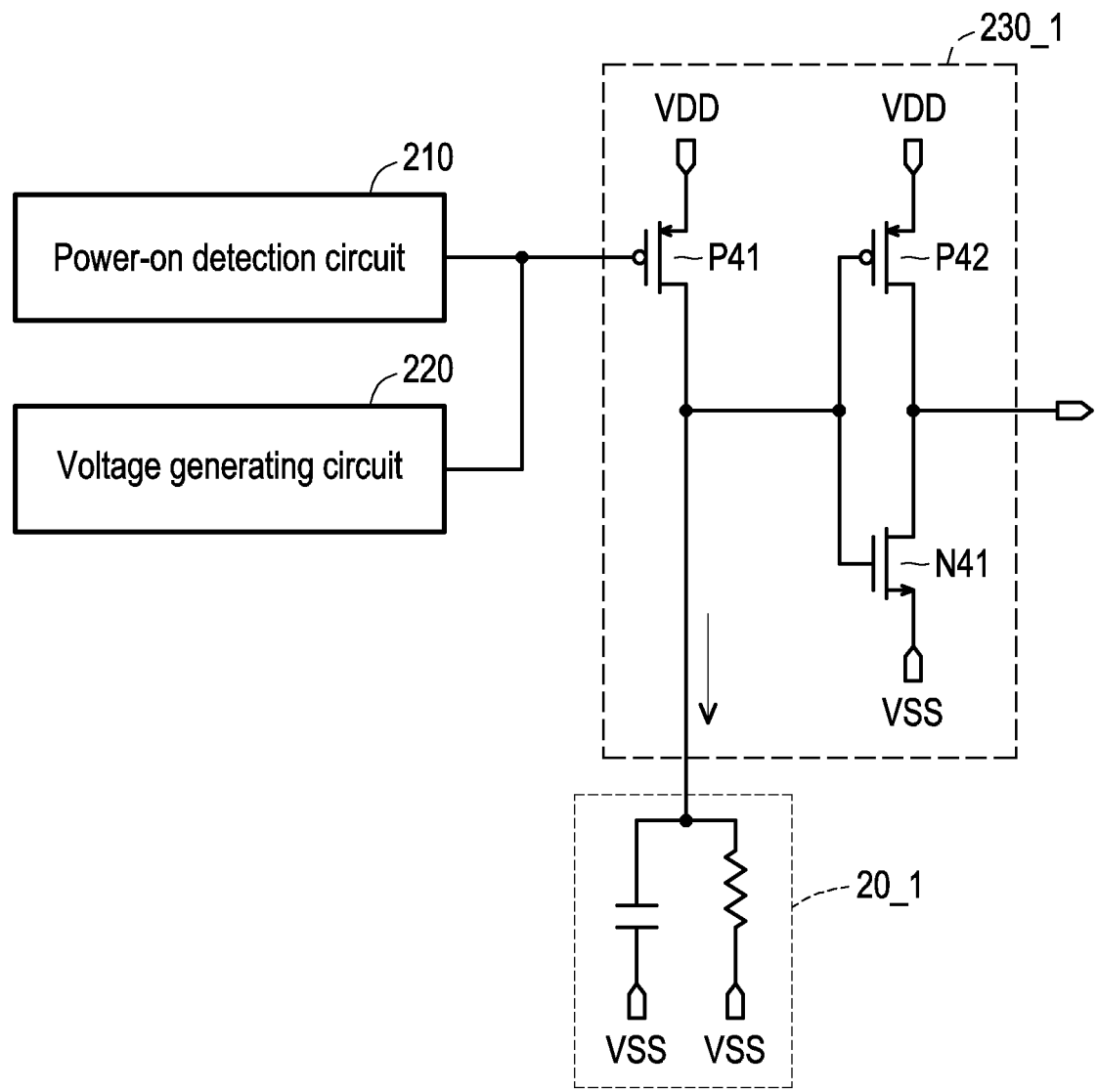
FIG. 4 is a schematic circuit diagram of an anti-fuse sensing circuit according to an embodiment of the disclosure.

FIG. 4 is a schematic circuit diagram of an anti-fuse sensing circuit 230_1 according to an embodiment of the disclosure. FIG. 4 also shows the equivalent circuit of the anti-fuse 20_1. For the anti-fuse sensing circuit 230_1 shown in FIG. 2, reference may be made to the relevant description of the anti-fuse sensing circuit 230_1 shown in FIG. 4. For the other anti-fuse sensing circuits 230_2 to 230_n and the other anti-fuses 20_2 to 20_n, reference and analogy may be made to the relevant descriptions of the anti-fuse sensing circuit 230_1 and the anti-fuse 20_1, which will not be repeated. The anti-fuse sensing circuit 230_1 is adapted to sense the resistance state (blown/unblown state) of the anti-fuse 20_1. The anti-fuse 20_1 is a commonly known element, and thus will not be repeatedly described here. In the embodiment shown in FIG. 4, the anti-fuse sensing circuit 230_1 includes a transistor P41, a transistor P42, and a transistor N41.

A control terminal (e.g., a gate) of the transistor P41 serves as the control terminal of the anti-fuse sensing circuit 230_1 to be coupled to the power-on detection circuit 210 and the voltage generating circuit 220. A first terminal (e.g., a source) of the transistor P41 is coupled to a power voltage VDD. A second terminal (e.g., a drain) of the transistor P41 is configured to be coupled to the anti-fuse 20_1. Based on the control voltage provided by the voltage generating circuit 220, the transistor P41 is turned on at any time after being powered-on except during blowing of the anti-fuse 20_1. A control terminal (e.g., a gate) of the transistor P42 is coupled to the second terminal of the transistor P41. A first terminal (e.g., a source) of the transistor P42 is coupled to the power voltage VDD. A control terminal (e.g., a gate) of the transistor N41 is coupled to the second terminal of the transistor P41. A first terminal (e.g., a source) of the transistor N41 is coupled to a reference voltage (e.g., a ground voltage VSS or other fixed voltages). A second terminal (e.g., a drain) of the transistor N41 is coupled to a second terminal (e.g., a drain) of the transistor P42.

Figure 5:
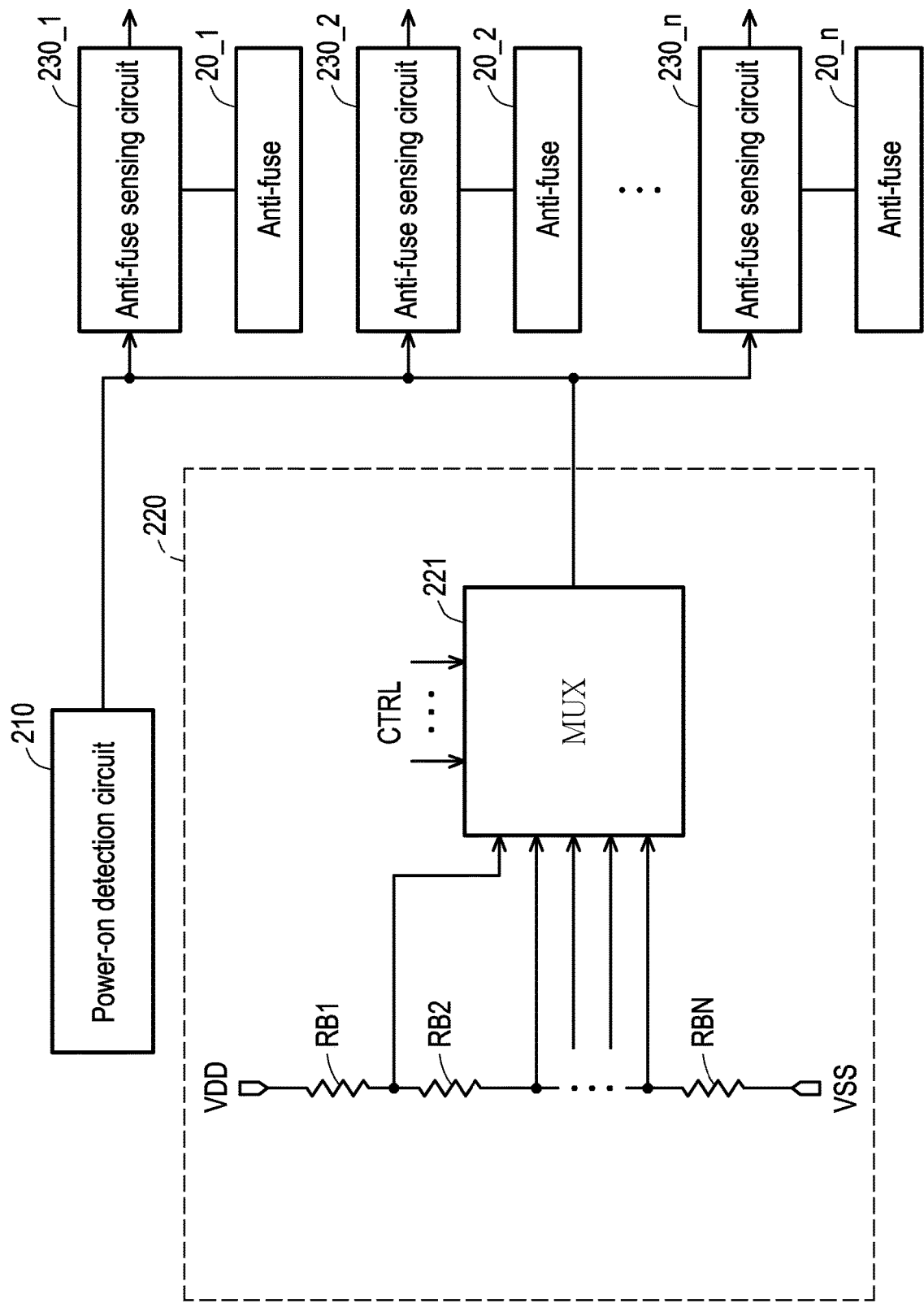
FIG. 5 is a schematic circuit block diagram of a voltage generating circuit according to an embodiment of the disclosure.

FIG. 5 is a schematic circuit block diagram of a voltage generating circuit 220 according to an embodiment of the disclosure. For the voltage generating circuit 220 shown in FIG. 2, reference may made to the relevant description of the voltage generating circuit 220 shown in FIG. 5. In the embodiment shown in FIG. 5, the voltage generating circuit 220 includes a resistor string composed of the resistors RB1, RB2, ..., RBN. A first terminal and a second terminal of the resistor string are respectively coupled to the power voltage VDD and the reference voltage (e.g., the ground voltage VSS or other fixed voltages). The voltage generating circuit 220 shown in FIG. 5 also includes a multiplexer (MUX) 221. A plurality of selection terminals of the multiplexer 221 are respectively coupled to a plurality of voltage-dividing nodes in the resistor string to receive different divided voltages. A common terminal of the multiplexer 221 is coupled to the control terminals of the anti-fuse sensing circuits 230_1 to 230_n to provide a control voltage. During the power-on transient period, the common terminal of the multiplexer 221 is in a high-impedance (Hi-Z) state. After the power-on transient period ends, based on the control of the control signal CTRL, the common terminal of the multiplexer 221 outputs a divided voltage (as the control voltage) of one of the voltage-dividing nodes of the resistor string (the resistors RB1 to RBN) to the control terminals of the anti-fuse sensing circuits 230_1 to 230_n.

Figure 6:
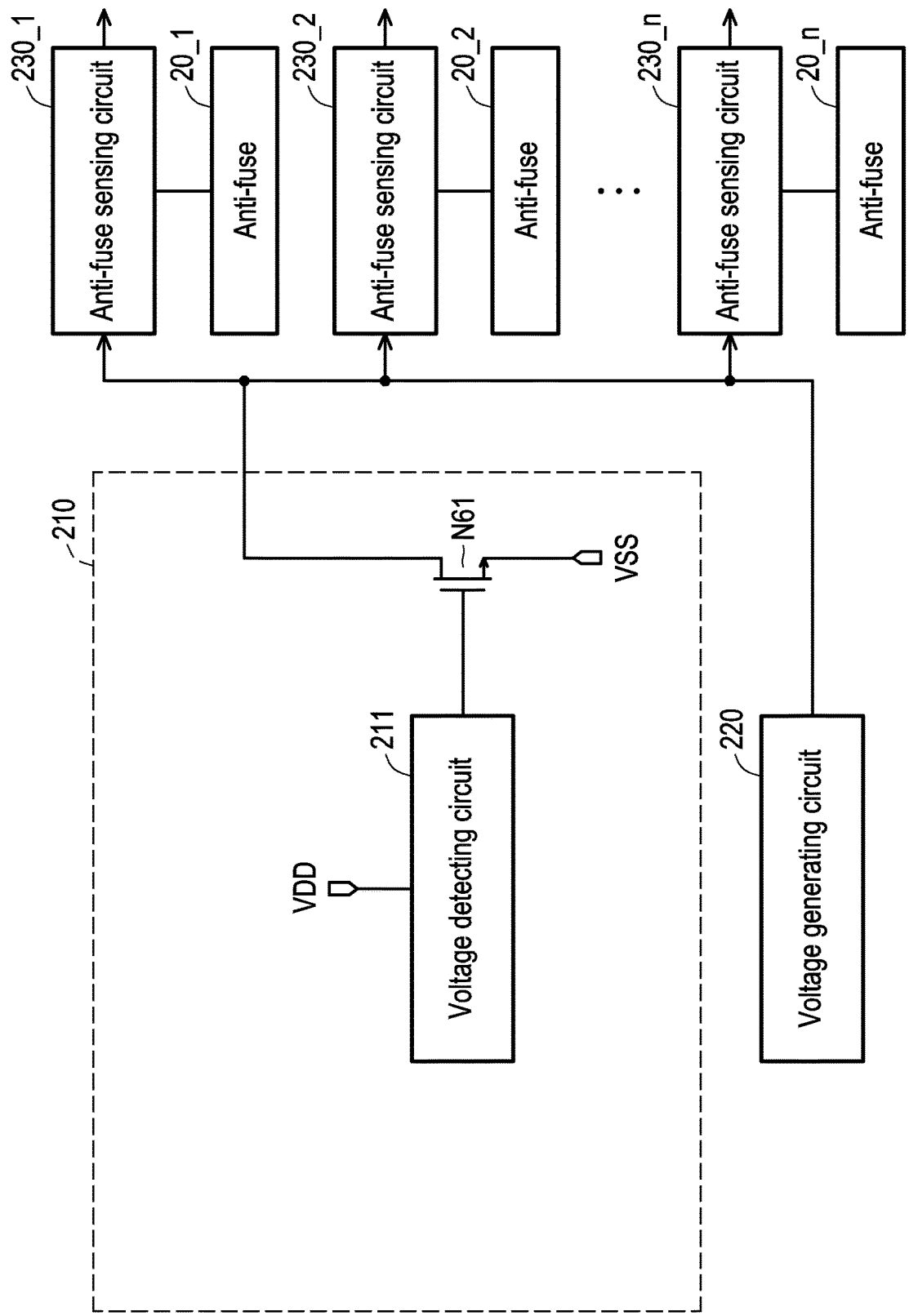
FIG. 6 is a schematic circuit block diagram of a power-on detection circuit according to an embodiment of the disclosure.

FIG. 6 is a schematic circuit block diagram of a power-on detection circuit 210 according to an embodiment of the disclosure. For the power-on detection circuit 210 shown in FIG. 2, reference may be made to the relevant description of the power-on detection circuit 210 shown in FIG. 6. In the embodiment shown in FIG. 6, the power-on detection circuit 210 includes a voltage detecting circuit 211 and an initialization switch N61. A first terminal of the initialization switch N61 is coupled to the initialization voltage (e.g., the ground voltage VSS or other fixed voltages). A second terminal of the initialization switch N61 serves as the output terminal of the power-on detection circuit 210 to be coupled to the control terminals of the anti-fuse sensing circuits 230_1 to 230_n. An output terminal of the voltage detecting circuit 211 is coupled to a control terminal of the initialization switch N61. The voltage detecting circuit 211 may detect the power-on transient period of the power voltage VDD. During the power-on transient period, the voltage detecting circuit 211 may turn on the initialization switch N61. After the power-on transient period ends, the voltage detecting circuit 211 may turn off the initialization switch N61.

Figure 7:
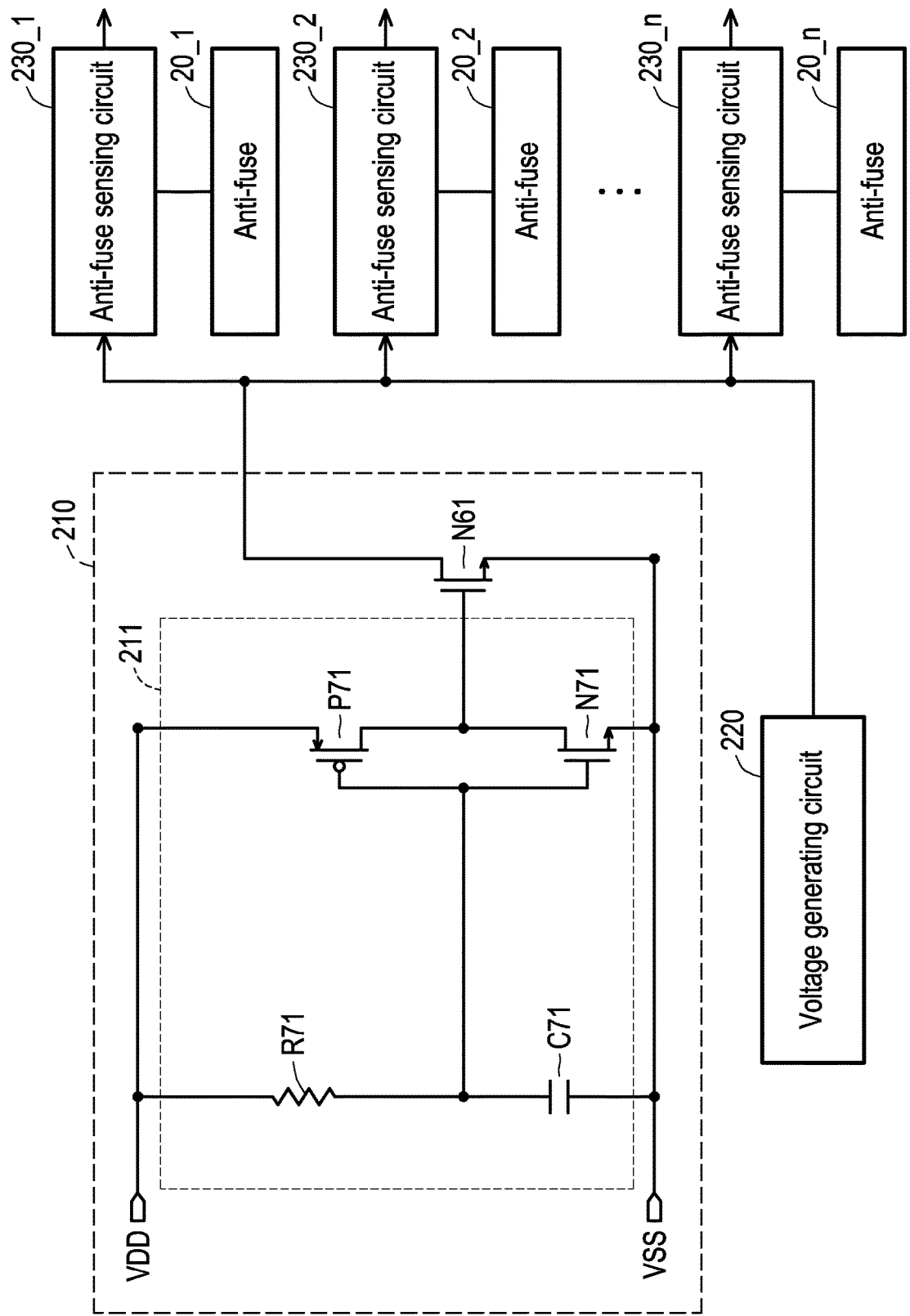
FIG. 7 is a schematic circuit diagram of a voltage detecting circuit according to an embodiment of the disclosure.

FIG. 7 is a schematic circuit diagram of a voltage detecting circuit 211 according to an embodiment of the disclosure. For the voltage detecting circuit 211 shown in FIG. 6, reference may be made to the relevant description of the voltage detecting circuit 211 shown in FIG. 7. In the embodiment shown in FIG. 7, the voltage detecting circuit 211 includes a resistor R71, a capacitor C71, a transistor P71, and a transistor N71. A first terminal of the resistor R71 is coupled to the power voltage VDD. A first terminal of the capacitor C71 is coupled to a second terminal of the resistor R71. A second terminal of the capacitor C71 is coupled to the reference voltage (e.g., the ground voltage VSS or other fixed voltages).

A first terminal (e.g., a source) of the transistor P71 is coupled to the power voltage VDD. A control terminal (e.g., a gate) of the transistor P71 is coupled to the first terminal of the capacitor C71. A second terminal (e.g., a drain) of the transistor P71 is coupled to the output terminal of the voltage detecting circuit 211, that is, coupled to the control terminal of the initialization switch N61. A first terminal (e.g., a source) of the transistor N71 is coupled to the reference voltage (e.g., the ground voltage VSS or other fixed voltages). A control terminal (e.g., a gate) of the transistor N71 is coupled to the first terminal of the capacitor C71. A second terminal (e.g., a drain) of the transistor N71 is coupled to the output terminal of the voltage detecting circuit 211, that is, coupled to the control terminal of the initialization switch N61.

With reference to FIG. 2, FIG. 4, FIG. 5, and FIG. 7, the power-on detection circuit 210 may detect the instantaneous action of the power voltage VDD to suppress the coupling noise of the control terminals of the anti-fuse sensing circuits 230_1 to 230_n. In the instant (during the power-on transient period) when the power voltage VDD is turned on, if the power-on detection circuit 210 is not present for voltage clamping, then the coupling noise caused by the power voltage VDD couples the voltages of the control terminals of the anti-fuse sensing circuits 230_1 to 230_n to an unexpectedly high voltage through the parasitic capacitance. Based on the initialization switch N61 being turned on, the power-on detection circuit 210 may instantly clamp the voltages of the control terminals of the anti-fuse sensing circuits 230_1 to 230_n around the initialization voltage (e.g., the ground voltage VSS) having a known level (an expected level) during the power-on transient period to prevent the voltage levels of the control terminals of the anti-fuse sensing circuits 230_1 to 230_n from being in an unknown state.

Specifically, when the power voltage VDD is turned on instantaneously, the current passing through the resistor R71 may charge the capacitor C71. At the initial stage of charging, the transistor P71 is turned on and the transistor N71 is turned off, and then the initialization switch N61 is turned on. After the initialization switch N61 is turned on, the power-on detection circuit 210 may instantly pull down the voltages of the control terminals of the anti-fuse sensing circuits 230_1 to 230_n to the initialization voltage (e.g., the ground voltage VSS) during the power-on transient period. The initialization voltage having a known level (an expected level) does not cause an unexpected change in the resistance state of any one of the anti-fuses 20_1 to 20_n.

As time increases (by about several microseconds (μs)), the current passing through the resistor R71 continues to charge the capacitor C71, so that the voltages of the control terminal of the transistor P71 and the control terminal of N71 is increasingly higher. As a result, the transistor P71 is turned off and the transistor N71 is turned on, and then the initialization switch N61 is turned off. Therefore, after the power-on transient period ends, that is, when the output of the voltage generating circuit 220 is ready, the power-on detection circuit 210 may stop providing the initialization voltage to prevent affecting the control operation on the anti-fuse sensing circuits 230_1 to 230_n by the voltage generating circuit 220.

Figure 8:
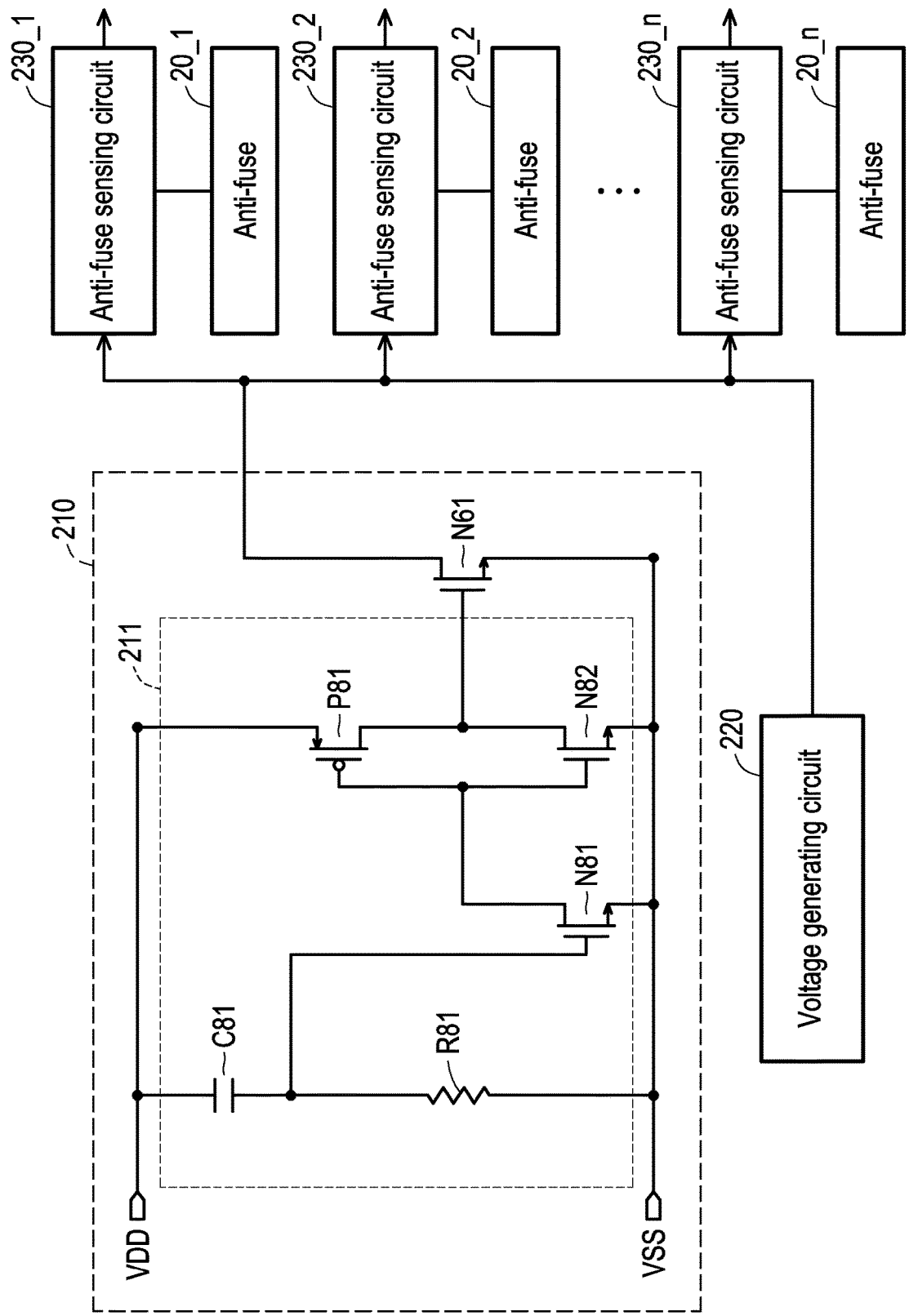
FIG. 8 is a schematic circuit diagram of a voltage detecting circuit according to another embodiment of the disclosure.

FIG. 8 is a schematic circuit diagram of a voltage detecting circuit 211 according to another embodiment of the disclosure. For the voltage detecting circuit 211 shown in FIG. 6, reference may be made to the relevant description of the voltage detecting circuit 211 shown in FIG. 8. In the embodiment shown in FIG. 8, the voltage detecting circuit 211 includes a capacitor C81, a resistor R81, a transistor N81, a transistor P81, and a transistor N82. A first terminal of the capacitor C81 is coupled to the power voltage VDD. A first terminal of the resistor R81 is coupled to a second terminal of the capacitor C81. A second terminal of the resistor R81 is coupled to the reference voltage (e.g., the ground voltage VSS or other fixed voltages).

A control terminal (e.g., a gate) of the transistor N81 is coupled to the first terminal of the resistor R81. A first terminal (e.g., a source) of the transistor N81 is coupled to the reference voltage (e.g., the ground voltage VSS or other fixed voltages). A first terminal (e.g., a source) of the transistor P81 is coupled to the power voltage VDD. A control terminal (e.g., a gate) of the transistor P81 is coupled to a second terminal (e.g., a drain) of the transistor N81. A second terminal (e.g., a drain) of the transistor P81 is coupled to the output terminal of the voltage detecting circuit 211, that is, coupled to the control terminal of the initialization switch N61. A first terminal (e.g., a source) of the transistor N82 is coupled to the reference voltage (e.g., the ground voltage VSS or other fixed voltages). A control terminal (e.g., a gate) of the transistor N82 is coupled to the second terminal of the transistor N81. A second terminal (e.g., a drain) of the transistor N82 is coupled to the output terminal of the voltage detecting circuit 211, that is, coupled to the control terminal of the initialization switch N61.

Figure 9:
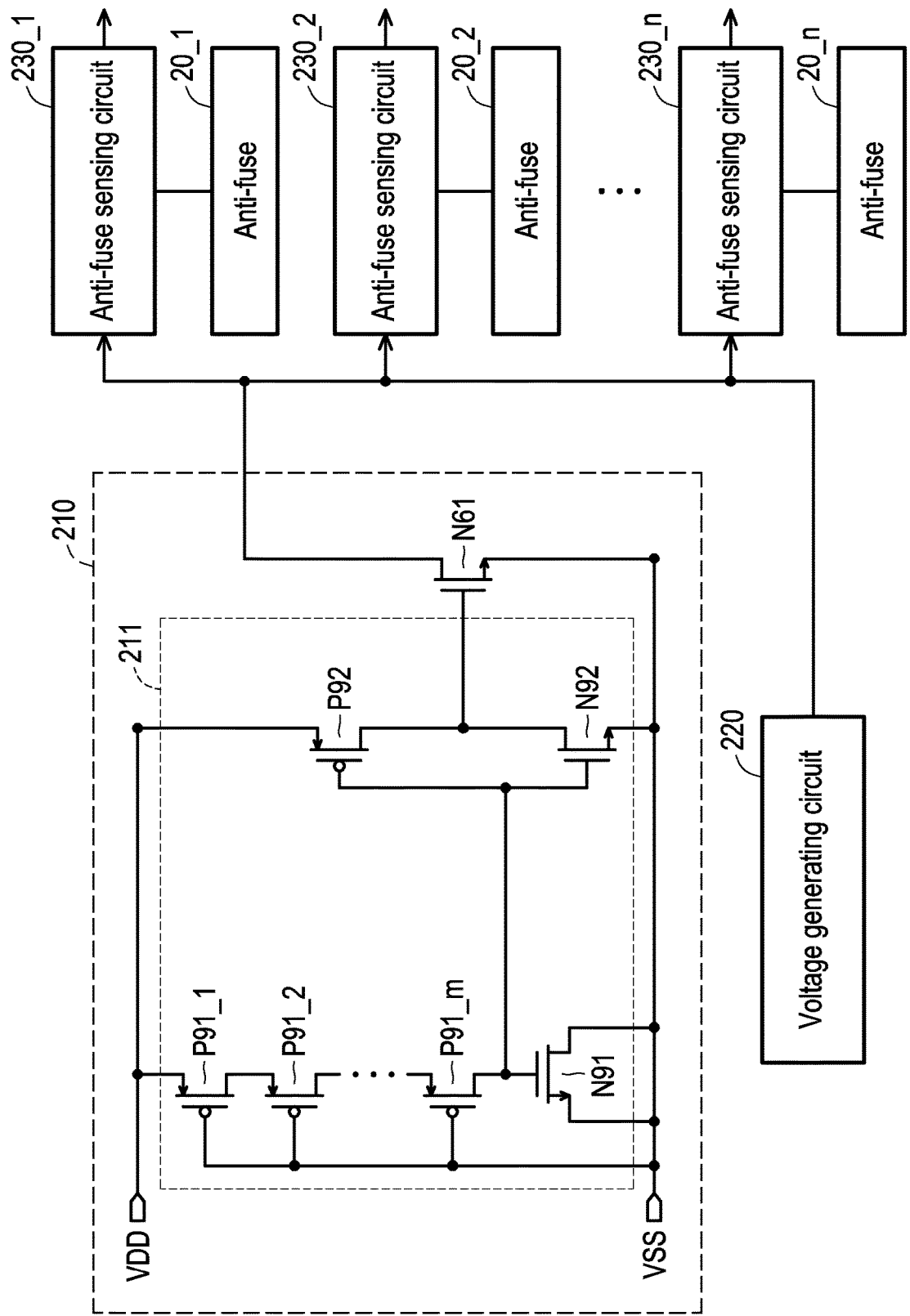
FIG. 9 is a schematic circuit diagram of a voltage detecting circuit according to yet another embodiment of the disclosure.

FIG. 9 is a schematic circuit diagram of a voltage detecting circuit 211 according to yet another embodiment of the disclosure. For the voltage detecting circuit 211 shown in FIG. 6, reference may be made to the relevant description of the voltage detecting circuit 211 shown in FIG. 9. In the embodiment shown in FIG. 9, the voltage detecting circuit 211 includes a transistor P91_1, a transistor P91_2, . . . , a transistor P91_m, a transistor N91, a transistor P92, and a transistor N92. A first terminal (e.g., a source) and a second terminal (e.g., a drain) of the transistor N91 are coupled to the reference voltage (e.g., the ground voltage VSS or other fixed voltages). The transistors P91_1 to P91_m are connected in series between the power voltage VDD and a control terminal (e.g., a gate) of the transistor N91. Control terminals (e.g., gates) of the transistors P91_1 to P91_m are coupled to the reference voltage (e.g., the ground voltage VSS or other fixed voltages).

A first terminal (e.g., a source) of the transistor P92 is coupled to the power voltage VDD. A control terminal (e.g., a gate) of the transistor P92 is coupled to the control terminal of the transistor N91. A second terminal (e.g., a drain) of the transistor P92 is coupled to the output terminal of the voltage detecting circuit 211, that is, coupled to the control terminal of the initialization switch N61. A first terminal (e.g., a source) of the transistor N92 is coupled to the reference voltage (e.g., the ground voltage VSS or other fixed voltages). A control terminal (e.g., a gate) of the transistor N92 is coupled to the control terminal of the transistor N91. A second terminal (e.g., a drain) of the transistor N92 is coupled to the output terminal of the voltage detecting circuit 211, that is, coupled to the control terminal of the initialization switch N61.

Figure 10:
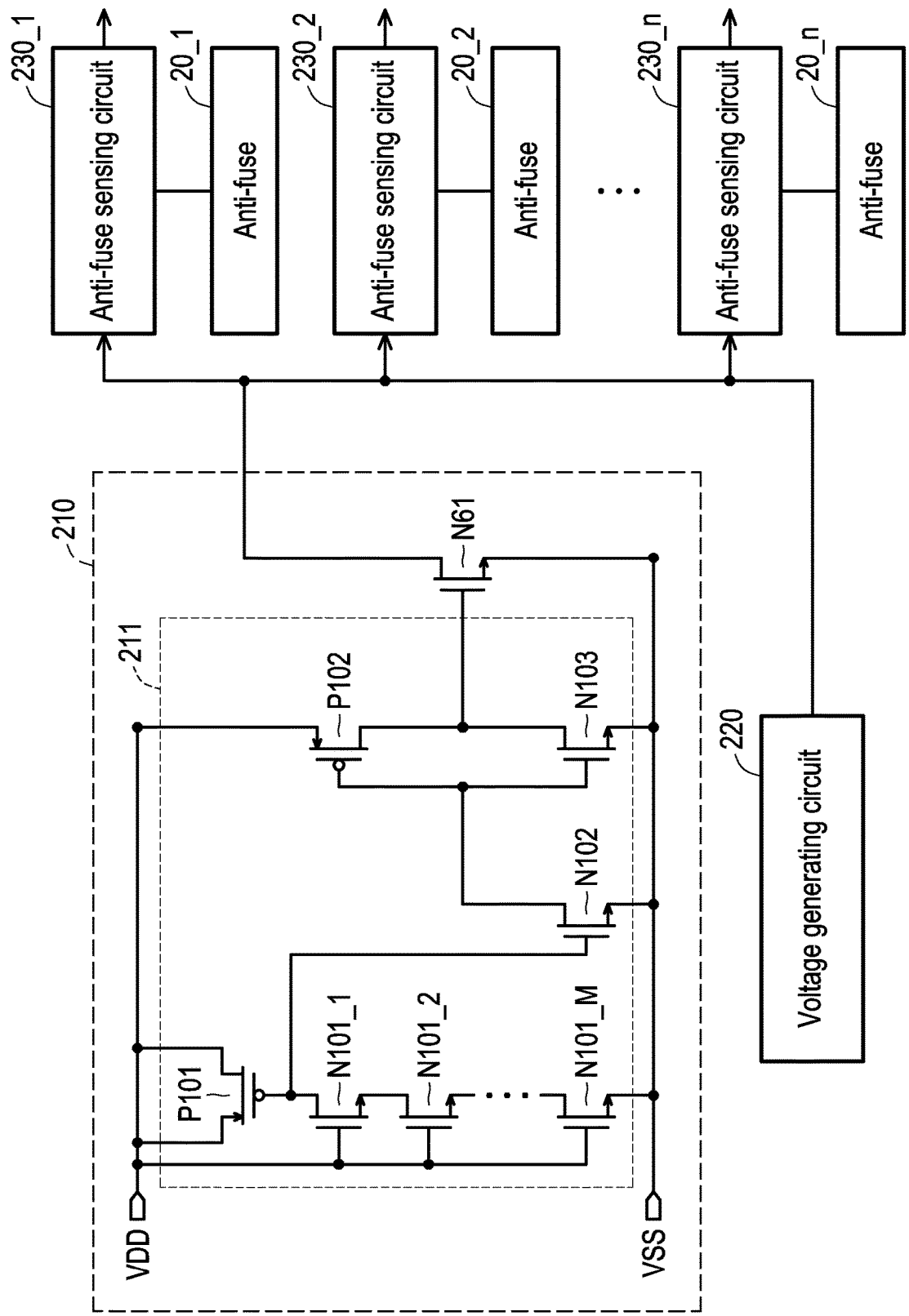
FIG. 10 is a schematic circuit diagram of a voltage detecting circuit according to still another embodiment of the disclosure.

FIG. 10 is a schematic circuit diagram of a voltage detecting circuit 211 according to still another embodiment of the disclosure. For the voltage detecting circuit 211 shown in FIG. 6, reference may be made to the relevant description of the voltage detecting circuit 211 shown in FIG. 10. In the embodiment shown in FIG. 10, the voltage detecting circuit 211 includes a transistor P101, a transistor N101_1, a transistor N101_2, . . . , a transistor N101_M, a transistor N102, a transistor P102, and a transistor N103. A first terminal (e.g., a source) and a second terminal (e.g., a drain) of the transistor P101 are coupled to the power voltage VDD. The transistors N101_1 to N101_M are connected in series between the reference voltage (e.g., the ground voltage VSS or other fixed voltages) and a control terminal (e.g., a gate) of the transistor P101. Control terminals (e.g., gates) of the transistors N101_1 to N101_M are coupled to the power voltage VDD.

A control terminal of the transistor N102 is coupled to the control terminal of the transistor P101. A first terminal (e.g., a source) of the transistor N102 is coupled to the reference voltage (e.g., the ground voltage VSS or other fixed voltages). A first terminal (e.g., a source) of the transistor P102 is coupled to the power voltage VDD. A control terminal (e.g., a gate) of the transistor P102 is coupled to a second terminal (e.g., a drain) of the transistor N102. A second terminal (e.g., a drain) of the transistor P102 is coupled to the output terminal of the voltage detecting circuit 211, that is, coupled to the control terminal of the initialization switch N61. A first terminal (e.g., a source) of the transistor N103 is coupled to the reference voltage (e.g., the ground voltage VSS or other fixed voltages). A control terminal (e.g., a gate) of the transistor N103 is coupled to the second terminal of the transistor N102. A second terminal (e.g., a drain) of the transistor N103 is coupled to the output terminal of the voltage detecting circuit 211, that is, coupled to the control terminal of the initialization switch N61.

Figure 11:
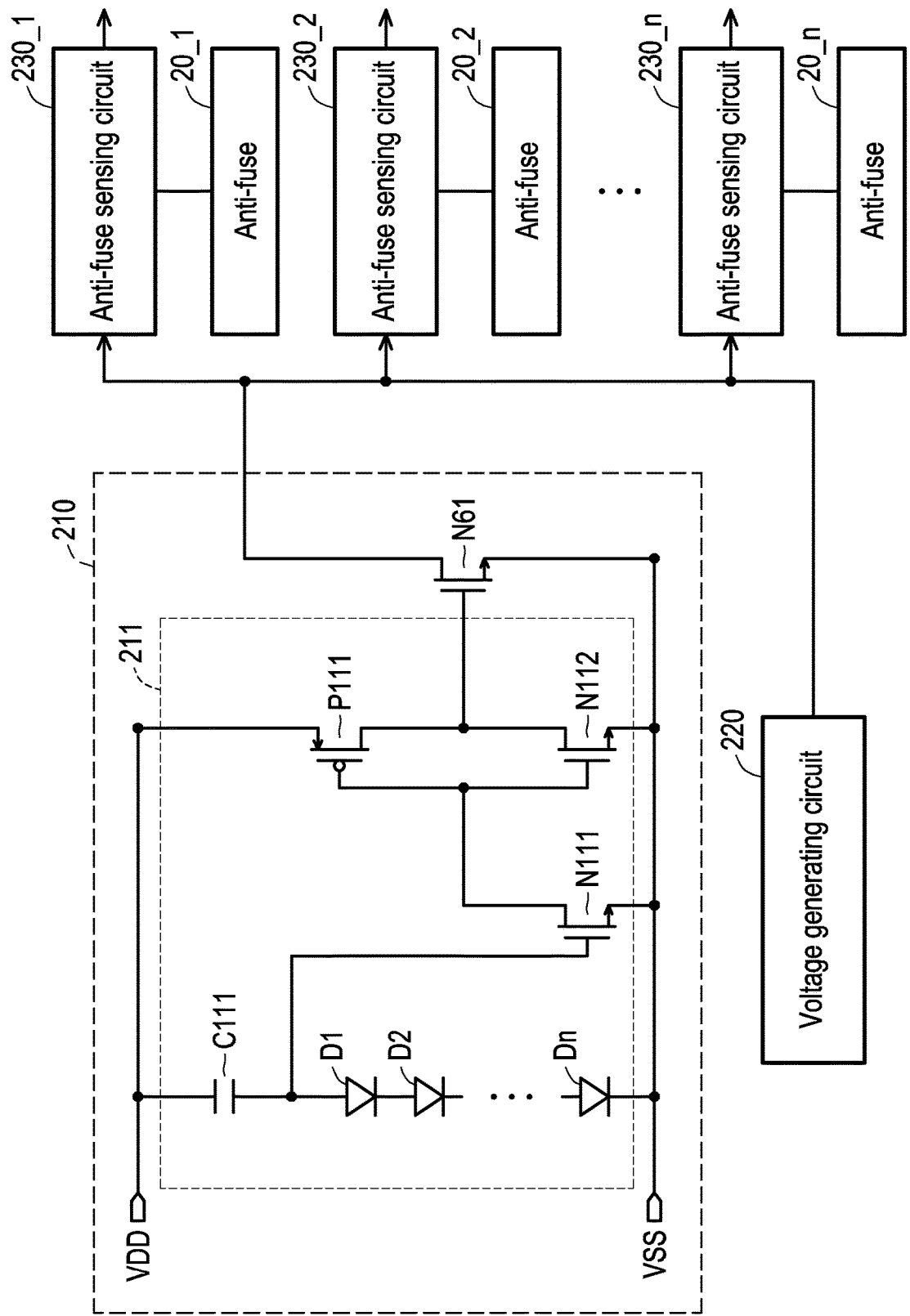
FIG. 11 is a schematic circuit diagram of a voltage detecting circuit according to yet another embodiment of the disclosure.

FIG. 11 is a schematic circuit diagram of a voltage detecting circuit 211 according to yet another embodiment of the disclosure. For the voltage detecting circuit 211 shown in FIG. 6, reference may be made to the relevant description of the voltage detecting circuit 211 shown in FIG. 11. In the embodiment shown in FIG. 11, the voltage detecting circuit 211 includes a capacitor C111, a diode D1, a diode D2, . . . , a diode Dn, a transistor N111, a transistor P111, and a transistor N112. A first terminal of the capacitor C111 is coupled to the power voltage VDD. The diodes D1 to Dn are connected in series in a forward-biased manner between the reference voltage (e.g., the ground voltage VSS or other fixed voltages) and a second terminal of the capacitor C111.

A control terminal (e.g., a gate) of the transistor N111 is coupled to the second terminal of the capacitor C111. A first terminal (e.g., a source) of the transistor N111 is coupled to the reference voltage (e.g., the ground voltage VSS or other fixed voltages). A first terminal (e.g., a source) of the transistor P111 is coupled to the power voltage VDD. A control terminal (e.g., a gate) of the transistor P111 is coupled to a second terminal (e.g., a drain) of the transistor N111. A second terminal (e.g., a drain) of the transistor P111 is coupled to the output terminal of the voltage detecting circuit 211, that is, coupled to the control terminal of the initialization switch N61. A first terminal (e.g., a source) of the transistor N112 is coupled to the reference voltage (e.g., the ground voltage VSS or other fixed voltages). A control terminal (e.g., a gate) of the transistor N112 is coupled to the second terminal of the transistor N111. A second terminal (e.g., a drain) of the transistor N112 is coupled to the output terminal of the voltage detecting circuit 211, that is, coupled to the control terminal of the initialization switch N61.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An anti-fuse sensing device, comprising:
    an anti-fuse sensing circuit adapted to sense a resistance state of an anti-fuse based on a control voltage;
    a voltage generating circuit having an output terminal coupled to a control terminal of the anti-fuse sensing circuit to provide the control voltage; and
    a power-on detection circuit having an output terminal coupled to the control terminal of the anti-fuse sensing circuit, wherein
    during a power-on transient period of the voltage generating circuit, the power-on detection circuit provides an initialization voltage to the control terminal of the anti-fuse sensing circuit to prevent a voltage level of the control terminal of the anti-fuse sensing circuit from being in an unknown state; and
    during a period when the voltage generating circuit provides the control voltage after the power-on transient period ends, the power-on detection circuit stops providing the initialization voltage to the control terminal of the anti-fuse sensing circuit.

2. The anti-fuse sensing device according to claim 1, wherein the anti-fuse sensing circuit comprises:
    a first transistor having a control terminal serving as the control terminal of the anti-fuse sensing circuit to be coupled to the voltage generating circuit and the power-on detection circuit, wherein a first terminal of the first transistor is coupled to a power voltage, and a second terminal of the first transistor is coupled to the anti-fuse;
    a second transistor having a control terminal coupled to the second terminal of the first transistor, wherein a first terminal of the second transistor is coupled to the power voltage; and
    a third transistor having a control terminal coupled to the second terminal of the first transistor, wherein a first terminal of the third transistor is coupled to a reference voltage, and a second terminal of the third transistor is coupled to a second terminal of the second transistor.

3. The anti-fuse sensing device according to claim 1, wherein the voltage generating circuit comprises:
    a resistor string having a first terminal and a second terminal respectively coupled to a power voltage and a reference voltage; and
    a multiplexer having a plurality of selection terminals respectively coupled to a plurality of voltage-dividing nodes in the resistor string, wherein a common terminal of the multiplexer is coupled to the control terminal of the anti-fuse sensing circuit to provide the control voltage.

4. The anti-fuse sensing device according to claim 3, wherein the common terminal of the multiplexer is in a high-impedance state during the power-on transient period, and the common terminal of the multiplexer outputs a divided voltage of one of the voltage-dividing nodes as the control voltage after the power-on transient period ends.

5. The anti-fuse sensing device according to claim 1, wherein the power-on detection circuit comprises:
    an initialization switch having a first terminal coupled to the initialization voltage, wherein a second terminal of the initialization switch serves as the output terminal of the power-on detection circuit to be coupled to the control terminal of the anti-fuse sensing circuit; and
    a voltage detecting circuit, having an output terminal coupled to a control terminal of the initialization switch, configured to detect the power-on transient period of a power voltage, wherein the voltage detecting circuit turns on the initialization switch during the power-on transient period, and the voltage detecting circuit turns off the initialization switch after the power-on transient period ends.

6. The anti-fuse sensing device according to claim 5, wherein the voltage detecting circuit comprises:
    a resistor having a first terminal coupled to the power voltage;
    a capacitor having a first terminal coupled to a second terminal of the resistor, wherein a second terminal of the capacitor is coupled to a reference voltage;
    a first transistor having a first terminal coupled to the power voltage, wherein a control terminal of the first transistor is coupled to the first terminal of the capacitor, and a second terminal of the first transistor coupled to the output terminal of the voltage detecting circuit; and
    a second transistor having a first terminal coupled to the reference voltage, wherein a control terminal of the second transistor is coupled to the first terminal of the capacitor, and a second terminal of the second transistor is coupled to the output terminal of the voltage detecting circuit.

7. The anti-fuse sensing device according to claim 5, wherein the voltage detecting circuit comprises:
    a capacitor having a first terminal coupled to the power voltage;
    a resistor having a first terminal coupled to a second terminal of the capacitor, wherein a second terminal of the resistor is coupled to a reference voltage;

a first transistor having a control terminal coupled to the first terminal of the resistor, wherein a first terminal of the first transistor is coupled to the reference voltage;

a second transistor having a first terminal coupled to the power voltage, wherein a control terminal of the second transistor is coupled to a second terminal of the first transistor, and a second terminal of the second transistor is coupled to the output terminal of the voltage detecting circuit; and a third transistor having a first terminal coupled to the reference voltage, wherein a control terminal of the third transistor is coupled to the second terminal of the first transistor, and a second terminal of the third transistor is coupled to the output terminal of the voltage detecting circuit.

8. The anti-fuse sensing device according to claim 5, wherein the voltage detecting circuit comprises:

a first transistor having a first terminal and a second terminal coupled to a reference voltage;

a plurality of second transistors connected in series between the power voltage and a control terminal of the first transistor, wherein a control terminal of each of the second transistors is coupled to the reference voltage;

a third transistor having a first terminal coupled to the power voltage, wherein a control terminal of the third transistor is coupled to the control terminal of the first transistor, and a second terminal of the third transistor is coupled to the output terminal of the voltage detecting circuit; and a fourth transistor having a first terminal coupled to the reference voltage, wherein a control terminal of the fourth transistor is coupled to the control terminal of the first transistor, and a second terminal of the fourth transistor is coupled to the output terminal of the voltage detecting circuit.

9. The anti-fuse sensing device according to claim 5, wherein the voltage detecting circuit comprises:

a first transistor having a first terminal and a second terminal coupled to the power voltage;

a plurality of second transistors connected in series between a reference voltage and a control terminal of the first transistor, wherein a control terminal of each of the second transistors is coupled to the power voltage;

a third transistor having a control terminal coupled to the control terminal of the first transistor, wherein a first terminal of the third transistor is coupled to the reference voltage;

a fourth transistor having a first terminal coupled to the power voltage, wherein a control terminal of the fourth transistor is coupled to a second terminal of the third transistor, and a second terminal of the fourth transistor is coupled to the output terminal of the voltage detecting circuit; and a fifth transistor having a first terminal coupled to the reference voltage, wherein a control terminal of the fifth transistor is coupled to the second terminal of the third transistor, and a second terminal of the fifth transistor is coupled to the output terminal of the voltage detecting circuit.

10. The anti-fuse sensing device according to claim 5, wherein the voltage detecting circuit comprises:

a capacitor having a first terminal coupled to the power voltage;

a plurality of diodes connected in series in a forward-biased manner between a reference voltage and a second terminal of the capacitor;

a first transistor having a control terminal coupled to the second terminal of the capacitor, wherein a first terminal of the first transistor is coupled to the reference voltage;

a second transistor having a first terminal coupled to the power voltage, wherein a control terminal of the second transistor is coupled to a second terminal of the first transistor, and a second terminal of the second transistor is coupled to the output terminal of the voltage detecting circuit; and a third transistor having a first terminal coupled to the reference voltage, wherein a control terminal of the third transistor is coupled to the second terminal of the first transistor, and a second terminal of the third transistor is coupled to the output terminal of the voltage detecting circuit.

11. An operation method of an anti-fuse sensing device, comprising:

during a power-on transient period of a voltage generating circuit of the anti-fuse sensing device, providing an initialization voltage by a power-on detection circuit of the anti-fuse sensing device to a control terminal of an anti-fuse sensing circuit of the anti-fuse sensing device to prevent a voltage level of the control terminal of the anti-fuse sensing circuit from being in an unknown state;

after the power-on transient period ends, stopping providing the initialization voltage to the control terminal of the anti-fuse sensing circuit by the power-on detection circuit, and providing a control voltage to the control terminal of the anti-fuse sensing circuit by the voltage generating circuit; and sensing a resistance state of an anti-fuse by the anti-fuse sensing circuit based on the control voltage.

* * * * *